United States Patent
Budde et al.

(10) Patent No.: US 7,964,785 B2
(45) Date of Patent: Jun. 21, 2011

(54) HEATING APPARATUS COMPRISING A THERMOELECTRIC MODULE

(75) Inventors: Jörn Budde, Potsdam (DE); Jens Baade, Neubrandenburg (DE)

(73) Assignee: Webasto AG, Stockdorf (DE)

(*) Notice: Subject to any disclaimer, the term of this patent is extended or adjusted under 35 U.S.C. 154(b) by 213 days.

(21) Appl. No.: 11/993,661

(22) PCT Filed: Jun. 23, 2006

(86) PCT No.: PCT/DE2006/001078
§ 371 (c)(1),
(2), (4) Date: Mar. 27, 2008

(87) PCT Pub. No.: WO2006/136148
PCT Pub. Date: Dec. 28, 2006

(65) Prior Publication Data
US 2010/0065098 A1 Mar. 18, 2010

(30) Foreign Application Priority Data
Jun. 23, 2005 (DE) .................. 10 2005 029 182

(51) Int. Cl.
*H01L 35/30* (2006.01)
(52) U.S. Cl. ..................................... 136/205
(58) Field of Classification Search ........... 136/200–242
See application file for complete search history.

(56) References Cited

U.S. PATENT DOCUMENTS

| | | | | |
|---|---|---|---|---|
| 3,377,206 A | * | 4/1968 | Emeis et al. | 136/212 |
| 3,539,399 A | * | 11/1970 | Harvey | 136/212 |
| 3,617,390 A | | 11/1971 | De Bucs et al. | |
| 3,619,390 A | * | 11/1971 | Dillenberg | 205/717 |
| 4,976,098 A | * | 12/1990 | Meyer et al. | 57/308 |
| 5,450,869 A | * | 9/1995 | Brittain et al. | 136/203 |
| 6,662,571 B1 | * | 12/2003 | Nagy et al. | 62/3.2 |

FOREIGN PATENT DOCUMENTS

| | | |
|---|---|---|
| CN | 85104503 A | 12/1986 |
| DE | 1278578 B | 9/1968 |
| DE | 69712482 T2 | 1/2003 |
| DE | 10235601 | 8/2003 |
| DE | 10235601 A1 | 8/2003 |
| JP | 2001-53342 A | 2/2001 |
| JP | 2001-144337 A | 5/2001 |

\* cited by examiner

*Primary Examiner* — Jennifer K. Michener
*Assistant Examiner* — Magali P Slawski
(74) *Attorney, Agent, or Firm* — Fitch, Even, Tabin & Flannery; John M. Naber

(57) ABSTRACT

Disclosed is a thermoelectric module (100) which rests against a housing (12) via an elastic connection (26, 40, 42). Alternatively or additionally, a mechanical connection is provided with a heat-insulating material (50) between a housing (12) and a heat exchanger (26). Furthermore, a heat conducting medium is alternatively or additionally provided between the thermoelectric module (100) and the first housing and/or between the thermoelectric module (100) and a heat exchanger (26).

13 Claims, 1 Drawing Sheet

HEATING APPARATUS COMPRISING A THERMOELECTRIC MODULE

Figure 1:
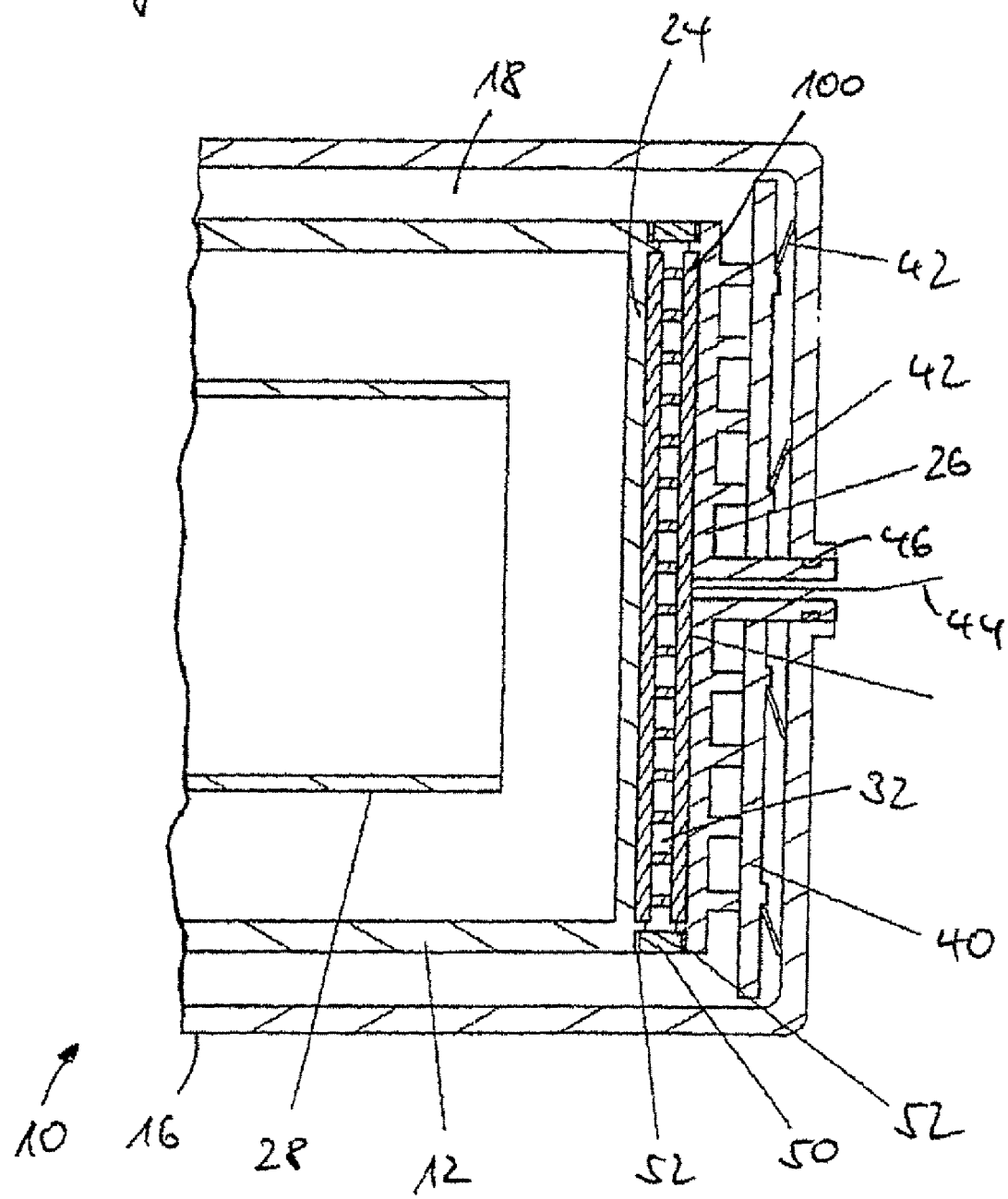

This application is a 35 U.S.C. §371 National Stage entry of PCT/DE2006/001078, filed Jun. 23, 2006, which claims priority from German Patent Application No.: DE 10 2005 029 182.1, filed Jun. 23, 2005, the contents of which are herein incorporated by reference.

The invention relates to a heating apparatus, with a first housing, the inside of which has adjacent to it a region for the routing of hot exhaust gases, a second housing, which at least partially surrounds the first housing, a medium to be heated flowing through an interspace between the first housing and the second housing, and a thermoelectric module (TEM) which is arranged in the interspace and is suitable for generating an electrical voltage by virtue of a temperature difference between the exhaust gases and the medium to be heated, according to preferred aspects the thermoelectric module being arranged between the first housing and a heat exchanger.

A device of this type is known from DE 102 35 601 A1. The ability to convert heat energy into electrical energy by means of a device of this type makes it possible to generate the electrical energy required for operating the heating apparatus, for example for feeding a blower and a control, in the heating apparatus itself. The electrical energy that is generated can likewise be made available to other consumers in the motor vehicle, for example by feeding into the vehicle electrical power supply. The arrangement shown in DE 102 35 601 A1 has a thermoelectric device in the form of a thermoelectric module which is arranged between a first housing portion forming the "hot side" and a heat exchanger forming the "cold side". When the heating apparatus is in operation, a voltage can thus be picked up on the thermoelectric module, although problems may arise with regard to maintaining as high temperature differences as possible, to thermal expansions and to a lack of thermal conductivity between the thermoelectric module and the housing or the heat exchanger.

The object on which the invention is based is to overcome these problems of the prior art at least partially and at the same time, in particular, to improve the thermal and mechanical conditions of the arrangement.

This object is achieved by means of the features of the independent claims.

Advantageous embodiments of the invention are specified in the dependent claims.

The invention builds on the generic heating apparatus, according to a first aspect, in that the thermoelectric module is supported on the second housing via an elastic connection. Owing to this mounting of the thermoelectric module, an improvement in the compensation of thermally induced expansions is made available. The thermoelectric module is thus held in a stable way, but the elastic mounting makes sufficient flexibility available.

For example, this may be implemented such that the thermoelectric module is supported on the second housing via a heat exchanger and elastic means. The heat exchanger, around which the liquid or gaseous heat transfer medium flows, can thus assume the task of providing an elastic connection.

In a development of this idea, there may be provision for the thermoelectric module to be supported on the second housing via a heat exchanger and a plate supporting the heat exchanger and equipped with elastic means.

In this regard, it is possible for the heat exchanger and the plate equipped with elastic means to be produced in one piece.

In a simple and effective implementation of these arrangements compensating thermal expansions, the elastic connection comprises cup springs.

The invention builds on the generic heating apparatus, according to a second aspect, in that a mechanical connection between the first housing and the heat exchanger has a heat-insulating material. An undesirable temperature compensation between the first housing and the heat exchanger is thereby avoided, so that the thermoelectric device can operate with high efficiency.

For example, there may be provision for the heat-insulating material to contain aluminum oxide and/or mullite.

Furthermore, it is useful that the mechanical connection between the first housing and the heat exchanger has a sealing device which is suitable for sealing off the thermoelectric device with respect to the medium to be heated and for compensating thermally induced expansions. The mechanical connection can thus have, in particular, two components. One component is optimized in terms of heat insulation and the other component serves for providing the useful elasticity compensating thermal expansions. Given a suitable choice of material, these two components can be implemented in the form of a unitary component, that is to say in the form of a highly heat-insulating elastic seal.

It is likewise possible for the first housing and the heat-insulating material and/or the sealing device to be produced in one piece.

In a comparable way, there may be provision for the heat exchanger and the heat-insulating material and/or the sealing device to be produced in one piece. The possibility of implementing these one-piece versions depends, in turn, on the suitable choice of material of the structural parts used.

The invention builds on the generic heating apparatus, according to a third aspect, in that a heat conduction means is provided between the thermoelectric module and the first housing and/or between the thermoelectric module and the heat exchanger. By virtue of such a heat conduction means, the thermal elements are tied up thermally to the heat source and the heat sink in an improved way.

This may be implemented, for example, in that the heat conduction means has a heat conduction paste.

Another possibility is for the heat conduction means to have a heat conduction foil.

The invention, then, is explained by way of example by means of a preferred embodiment, with reference to the accompanying drawings in which:

FIG. 1 shows a partial sectional view of a heating apparatus according to the invention.

FIG. 1 shows a partial sectional view of a heating apparatus according to the invention. The heating apparatus 10, that is to say, in particular, the heat exchanger arrangement illustrated, is of essentially axially symmetrical construction, an inner first housing 12 and an outer second housing 16 being provided. A flame tube 28 is arranged within the housings 12, 16, exhaust gases which emerge from the flame tube 28 heating the inside of the first housing 12. Between the first housing 12 and the second housing 16 an interspace 18 is provided through which a heat transfer medium, for example water, flows, so that the first housing 12 functions as a heat exchanger for the transmission of combustion heat to the heat transfer medium. A thermoelectric module 100 is arranged on a bottom of the first housing 12, said bottom being provided as a heat contact portion 24. The thermoelectric module 100 is connected via a thermally conductive medium, for example a paste or a foil, to the heat contact portion 24 of the first housing 12. The thermoelectric module 100 is connected on the other side to a heat exchanger 26 which is arranged in the interspace 18 between the first housing 12 and the second housing 16. The heat exchanger 26 is connected to the first housing 12 via a heat-insulating ring 50. The latter may consist, for example, of aluminum oxide or mullite. In order to prevent the heat transfer medium from penetrating into the interspace 32 between the first housing 12 and the heat exchanger 26, a sealing ring 52 is provided on both sides of the heat-insulating ring 50. With a suitable choice of material, the heat-insulating ring and the sealing device may be formed in one structural part. The heat exchanger 26 is supported on the second housing 16 via a plate 40 equipped with cup springs 42. A stable arrangement is thereby made available, reliable thermal contact between the thermoelectric module 100 and the first housing 12 and the heat exchanger 26 being available due to a suitable rating of the spring forces. The heat exchanger 26 is also connected to the second housing 16 in the region of the electrical connection 44 and is held there by the latter. The connection is made via a seal 46.

The features of the invention which are disclosed in the above description, in the drawings and in the claims may be essential for implementing the invention both individually and in any desired combination.

The invention claimed is:

1. A heating apparatus, comprising:
   a first housing having an inside which is adjacent to a region for routing of hot exhaust gases,
   a second housing, which at least partially surrounds the first housing,
   an interspace between the first housing and the second housing, which is adapted for receiving a medium to be heated flowing through said interspace, and
   a thermoelectric module (TEM) arranged in the interspace that is suitable for generating an electrical voltage by virtue of a temperature difference between the exhaust gases and the medium to be heated,
   a supporting plate having opposing first and second sides that is connected through a first side to the TEM,
   an elastic means on the second side of a supporting plate to urge the TEM module against a heat contact portion of the first housing, and
   wherein the medium to be heated is adapted to pass between the elastic means and a cold side of the TEM.

2. The heating apparatus of claim 1, wherein the heating apparatus includes a heat exchanger, and a first side of a supporting plate is connected via a heat exchanger to a thermoelectric module, whereby a thermoelectric module is supported on the second housing via a heat exchanger and an elastic means on the second side of said supporting plate.

3. The heating apparatus of claim 2 wherein the heat exchanger and the plate equipped with elastic means are produced in one piece.

4. The heating apparatus of claim 1, wherein the elastic means comprises cup springs.

5. The heating apparatus of claim 1, wherein
   a mechanical connection between the first housing and the heat exchanger comprises a heat-insulating material.

6. The heating apparatus of claim 5, wherein the heat-insulating material contains aluminum oxide and/or mullite.

7. The heating apparatus of claim 6, wherein the mechanical connection between the first housing and the heat exchanger has a sealing device which is suitable for sealing off the thermoelectric module with respect to the medium to be heated and for compensating thermally induced expansions.

8. The heating apparatus of claim 7, wherein the first housing and the heat-insulating material and/or the sealing device are produced in one piece.

9. The heating apparatus of claim 7, wherein the heat exchanger and the heat-insulating material and/or the sealing device are produced in one piece.

10. The heating apparatus according to claim 1, wherein
    the thermoelectric module is arranged between the first housing and a heat exchanger, and
    a heat conduction means is provided between the thermoelectric module and the first housing and/or between the thermoelectric module and the heat exchanger.

11. The heating apparatus of claim 10, wherein the heat conduction means has a heat conduction paste.

12. The heating apparatus of claim 10, wherein the heat conduction means has a heat conduction foil.

13. The heating apparatus of claim 1, wherein the support plate is a planar surface.

* * * * *